United States Patent
Brobston (10) Patent No.: US 8,620,233 B2
(45) Date of Patent: Dec. 31, 2013

(54) METHOD OF POWER AMPLIFIER PREDISTORTION ADAPTATION USING COMPRESSION DETECTION

(75) Inventor: Michael Lee Brobston, Allen, TX (US)

(73) Assignee: Samsung Electroncs Co., Ltd., Suwon-si (KR)

( * ) Notice: Subject to any disclaimer, the term of this patent is extended or adjusted under 35 U.S.C. 154(b) by 1181 days.

(21) Appl. No.: 12/081,215

(22) Filed: Apr. 11, 2008

(65) Prior Publication Data

US 2009/0256630 A1 Oct. 15, 2009

(51) Int. Cl.
*H04B 1/04* (2006.01)

(52) U.S. Cl.
USPC .......................... 455/114.3; 330/75; 330/107

(58) Field of Classification Search
USPC ......... 455/91, 114.2, 114.3; 330/75, 106, 107
See application file for complete search history.

(56) References Cited

U.S. PATENT DOCUMENTS

| | | | |
|---|---|---|---|
| 5,227,736 A | 7/1993 | Tucker et al. | |
| 6,396,345 B2 * | 5/2002 | Dolman | 330/149 |
| 6,587,514 B1 | 7/2003 | Wright et al. | |
| 2002/0186078 A1 | 12/2002 | Kobayashi | |

OTHER PUBLICATIONS

Notification of Transmittal of the International Search Report and the Written Opinion of the International Searching Authority, or the Declaration dated Nov. 20, 2009 in connection with PCT Application No. PCT/KR2009/001877.

* cited by examiner

*Primary Examiner* — Christian Hannon (57) ABSTRACT

A method of power amplifier predistortion that makes use of a compression detector circuit in a feedback loop in order to adapt the channel gain for changing transmitter behavior. By monitoring the compression behavior of the amplifier, the signal is scaled to compensate for gain and compression point variations in the power amplifier and transmitter, while keeping a predistortion correction function constant.

23 Claims, 8 Drawing Sheets

METHOD OF POWER AMPLIFIER PREDISTORTION ADAPTATION USING COMPRESSION DETECTION

BACKGROUND OF THE INVENTION

1. Field of the Invention

The present invention relates to a method for adapting power amplifier predistortion by using compression detection feedback.

2. Description of the Related Art

In wireless systems a power amplifier is frequently used as one of the final transmitter stages for the purpose of amplifying the transmitted waveform to the appropriate level to provide adequate signal-to-noise ratio over the link. To achieve reasonable efficiency from a power amplifier, the amplifier is often operated near its compression point. Yet at an operating output power at which the amplifier operates efficiently, the amplifier often undesirably generates a level of distortion on the waveform that corrupts the modulation accuracy of the waveform and generates potentially excessive noise in adjacent carrier regions.

Contemporarily, many forms of linearization have been developed in an effort to recover the modulation accuracy of the power amplifier while operating the power amplifier near the compression point in order to achieve the required efficiency. One such form of linearization is digital predistortion.

In various developing wireless standards such as 802.16e and Third Generation Partnership Project 2 (3GPP2) Long Term Evolution (LTE), Orthogonal Frequency-Division Multiplexing (OFDM) waveforms are used with high order quadrature modulation and multiple subcarriers. This form of modulation requires very good modulation accuracy in order to achieve an adequate bit error rate (BER) or frame error rate (FER). Even in the uplink path, an error vector magnitude (EVM) of less than 3% is required from the terminal transmitter. An ideal amplifier would be a totally linear device, but real amplifiers are only linear within certain practical limits. When an input signal is increased, the output also increases until a saturation point is reached where some part of the amplifier becomes saturated and cannot produce any more output; this is called clipping, and results in distortion. Without any form of linearization, a signal can only be transmitted within the linear operating region of the power amplifier with very poor efficiency. Another effect is that the OFDM waveforms used in these standards often have high peak-to-average ratios (PAPR) exceeding 9 dB. Therefore, in order to avoid saturating the power amplifier at the peaks of the waveform envelope, the average output power must be maintained at close to 9 dB below the saturation point of the amplifier.

Between the high PAPR of the OFDM waveform and the low EVM requirements of the uplink, the net result is that the terminal power amplifier operates at a relatively poor efficiency. Whereas terminal power amplifiers operated in Global System for Mobile communications (GSM) or Code division multiple access (CDMA) systems frequently achieve power added efficiencies (PAE) of 40 to 50% at a maximum rated power, the terminal power amplifiers used in mobile WiMax (802.16e) and LTE achieve a PAE of around 20% or less. Therefore to transmit a carrier at a comparable power level, more than twice the amount of DC power is required by the power amplifier. This causes a much greater drain on the terminal battery thereby causing a relatively short battery life. The short battery life effect has been widely experienced in broadband networks currently in operation.

One means to improve the terminal power amplifier efficiency and extend the battery life is adding digital predistortion to the terminal. This form of linearization allows the power amplifier to be operated at a lower output back-off since the linearization can then be used to correct the degraded EVM and Adjacent channel Power Ratio (ACPR) performance back to an acceptable level. Historically, digital predistortion has not been widely implemented in terminal transmitters because the power dissipation of the added signal processing circuitry has more than offset the reduction on power amplifier current drain. Therefore digital predistortion within wireless systems has often been limited to the base station transmitter operating at 10 to 40 watts. In this application the 2 or 3 watts of power dissipated by the predistortion circuitry is more than offset PA efficiency improvement realized. Yet it can be seen that if the power dissipation of the predistortion circuitry can be reduced to 100 mW or less, that a net improvement would be possible even in a terminal transmitter operating at ½ watt if the PAE of the power amplifier could be simply increased from 20% to 25%.

SUMMARY OF THE INVENTION

It is therefore an object of the present invention to provide an improved method and circuit for power amplifier predistortion.

It is another object of the present invention to provide a simplified circuit for power amplifier predistortion with limited hardware resources and low bandwidth for a feedback path It is still another object of the present invention to reduce the power consumption of the power amplifier circuit.

According to one aspect of the present invention, a circuit for amplifying signals is provided with a predistortion circuit for distorting an input signal in dependence upon a predistortion correction value selected from a plurality of predistortion correction values, and for adjusting the distorted signal in dependence upon a variation of circuit characteristics. A transceiver circuit is coupled to receive the output signal from the predistortion circuit, and processes the received signal in dependence upon a certain transceiver transfer function. An amplification circuit is coupled to receive the output signal from the transceiver circuit, and amplifies the signal in dependence upon an amplification transfer function. A compression detector circuit is coupled to the amplification circuit, detects whether the amplification circuit is operating in a compression mode, and generates a compression indication signal. A compare and adapt circuit is coupled to receive the compression indication signal, controls the predistortion circuit for controlling the adjustment of the distorted signal in dependence upon the received compression indication signal.

The compression detector circuit may be constructed with a first envelope detector circuit coupled to receive a first sampled signal from the input signal of the amplification circuit and generating a first envelope signal; a variable attenuator circuit coupled to receive a second sampled signal from the output signal of the amplification circuit and attenuating the received second sampled signal in dependence upon an attenuation factor; a second envelope detector circuit coupled to receive the attenuated signal and generating a second envelope signal; a difference amplifier circuit coupled to receive both the first envelope signal and the second envelope signal, and generating the compression indication signal in dependence upon the difference between the first envelope signal and the second envelope signal; and a detection calibration circuit coupled to receive the compression indication signal, and controlling the variable attenuator circuit to adjust the attenuation factor in dependence upon the received compression indication signal, in order to maintain the attenuated signal to be equal to the first sampled signal when the amplification circuit is not operating in a compression mode.

The detection calibration circuit may control the variable attenuator circuit continuously.

Alternatively, the detection calibration circuit may control the variable attenuator circuit only when a reference signal is input into the amplification circuit.

The compare and adapt circuit may be constructed with an analog-to-digital converter circuit coupled to receive the compression indication signal and outputting a sequence of compression indication samples; a variable delay circuit coupled to receive a sequence of amplitude samples of the input signal, and delaying the amplitude samples by a certain amount; a compression reference look-up table storing amplitude values and corresponding reference compression indication values, coupled to receive the delayed amplitude samples and outputting a sequence of reference compression indication samples; a time alignment circuit coupled to receive both of the sequence of reference compression indication samples and sequence of compression indication samples, and controlling the variable delay circuit by comparing the reference compression indication samples with the corresponding compression indication samples; a compare circuit coupled to both of the sequence of reference compression indication samples and sequence of compression indication samples, and generating a sequence of error values representing the differences between the corresponding reference compression indication samples and the corresponding compression indication samples; and an error integration circuit coupled to receive the sequence of error values, integrating the error values, and outputting a sequence of integrated error values.

The compare and adapt circuit may be further constructed with a threshold circuit coupled to sequentially receive the compression indication samples, controlling the error integration circuit to ignore the input error values whenever the compression indication sample exceeds a certain threshold value.

Alternatively, the compression detector circuit may be constructed with a first envelope detector circuit coupled to receive a first sampled signal from the input signal of the amplification circuit and generating a first envelope signal; a variable attenuator circuit coupled to receive a second sampled signal from the output signal of the amplification circuit and attenuating the received second sampled signal in dependence upon an attenuation factor; a second envelope detector circuit coupled to receive the attenuated signal and generating a second envelope signal; and a difference amplifier circuit coupled to receive both the first envelope signal and the second envelope signal and outputting the compression indication signal in dependence upon the difference of the first envelope signal and the second envelope signal.

In this case, the compare and adapt circuit may be constructed with an analog-to-digital converter circuit coupled to receive the compression indication signal and outputting a sequence of compression indication samples; a detection calibration circuit coupled to receive the sequence of compression indication samples, and controlling the variable attenuator circuit to adjust the attenuation factor in dependence upon the received sequence of compression indication samples, in order to maintain the attenuated signal to be equal to the first sampled signal when the amplification circuit is not operating in a compression mode; a variable delay circuit coupled to receive a sequence of amplitude samples of the input signal and delaying the amplitude samples by a certain amount; a compression reference look-up table storing amplitude values and corresponding compression indication values, coupled to receive the delayed amplitude samples and outputting a sequence of reference compression indication samples; a time alignment circuit coupled to receive both of the sequence of reference compression indication samples and sequence of compression indication samples, and controlling the variable delay circuit by comparing the reference compression indication samples with the corresponding compression indication samples; a compare circuit coupled to both of the sequence of reference compression indication samples and sequence of compression indication samples, and generating a sequence of error values representing the differences between the corresponding reference compression indication samples and the corresponding compression indication samples; and an error integration circuit coupled to receive the sequence of error values, integrating the error values, and outputting a sequence of integrated error values.

The predistortion circuit may be constructed with a Cartesian to polar conversion circuit coupled to receive the input signal and converting the received input signal into a sequence of amplitude samples; a predistortion look-up table storing amplitude sample values and corresponding predistortion correction values, coupled to sequentially receive the amplitude samples and outputting the corresponding sequence of predistortion correction values; a vector multiplier circuit coupled to sequentially receive the amplitude samples and the predistortion correction values and outputting a sequence of distorted amplitude samples; a multiplier circuit coupled to receive the sequence of distorted amplitude samples and a sequence of integrated error values from the compare and adapt circuit, multiplying the distorted amplitude samples with the corresponding integrated error values, and outputting a sequence of corrected amplitude samples; and a polar to Cartesian circuit coupled to convert the sequence of corrected amplitude samples.

According to another aspect of the present invention, a method for amplifying signals is provided to distort an input signal in dependence upon a predistortion correction value selected from a plurality of predistortion correction values, and to adjust the distorted signal in dependence upon a variation of circuit characteristics. The signal is then processed in dependence upon a certain transceiver transfer function, and amplified in dependence upon an amplification transfer function by an amplification circuit. A compression indication signal is generated indicating whether the amplification circuit is operating in a compression mode. In dependence upon the compression indication signal, the adjustment of the distorted signal is controlled.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

In the following disclosure, AM/AM stands for amplitude-to-amplitude, and AM/PM stands for amplitude-to-phase.

The invention will now be described more fully hereinafter with reference to the accompanying drawings.

Figure 1:
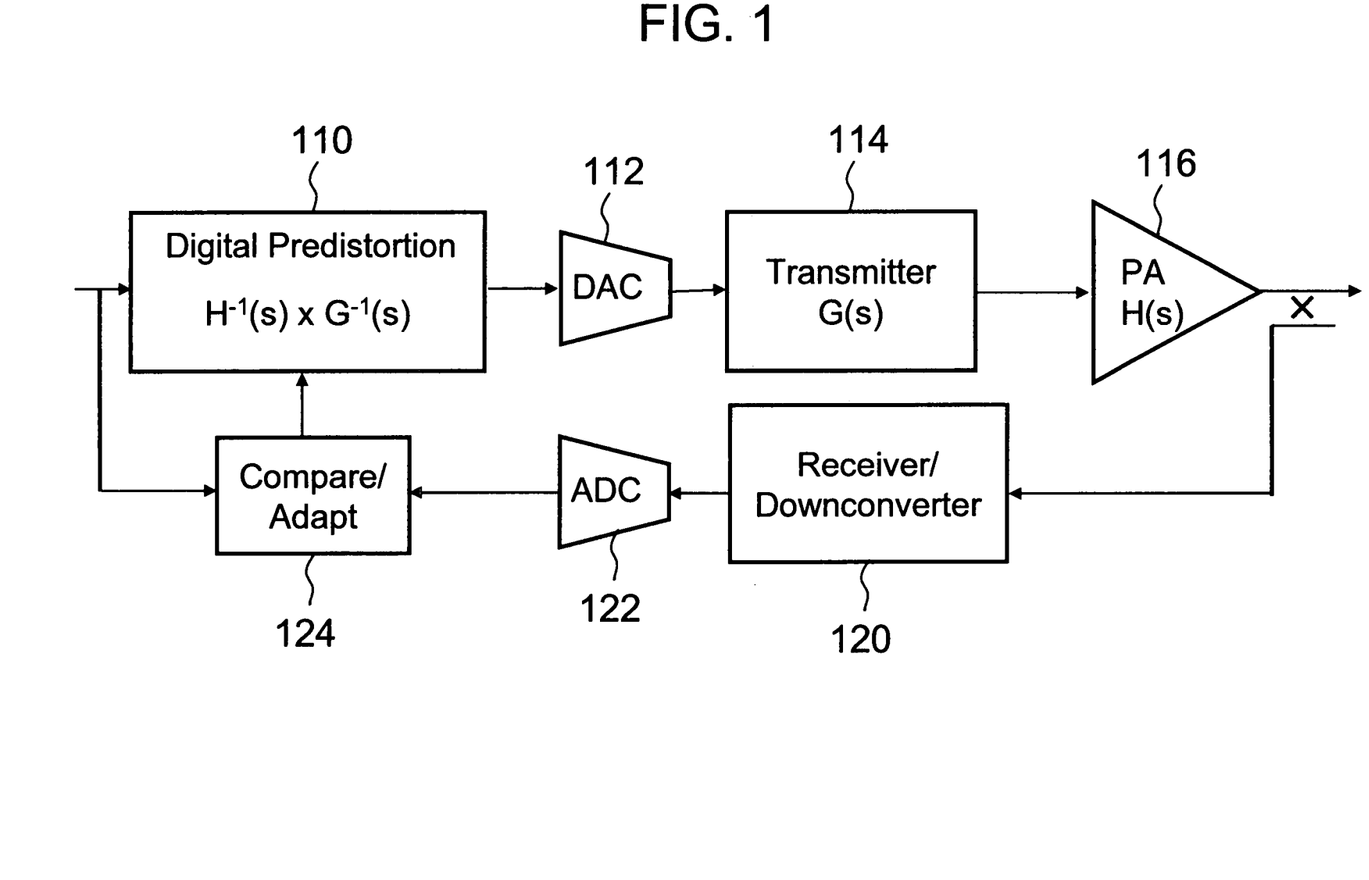
FIG. 1 schematically illustrates a contemporary adaptive digital predistortion architecture with feedback.

FIG. 1 illustrates an adaptive digital predistortion architecture with feedback. In most contemporary forms of digital predistortion, a digitized baseband waveform is predistorted by a Predistortion block 110 using a certain transfer function that represents the inverse of the expected power amplifier distortion characteristics. The predistorted waveform is converted by a digital-to-analog converter (DAC) 112. In order to ensure this predistortion transfer function is accurate and to compensate for variations of the characteristics of transmitter 114 and power amplifier 116, the sample of the output waveform of power amplifier 116 along with its intermodulation products are downconverted, demodulated, digitized and this digitized feedback waveform is compared to original baseband waveform by Compare and Adapt block 124, in order to determine how to appropriately adapt the predistortion transfer function. This comparison can be done using various techniques, but in general the comparison amounts to a process of comparing the distorted power amplifier output to a reference baseband waveform, extracting the amplitude-to-amplitude (AM/AM) and amplitude-to-phase (AM/PM) characteristics, and adapting the predistortion transfer function, $H^{-1}(s)$, to match the inverse of these characteristics. Since the transceiver transfer function, $G(s)$, also varies with time and temperature, the adaptation process also compensates the overall predistortion transfer function and effectively adapts the inverse transfer function of the transceiver, $G^{-1}(s)$, simultaneously.

In this commonly used form of predistortion, a bandwidth that is at least five times the signal bandwidth must be maintained throughout the entire feedback path in order to provide all the significant intermodulation distortion terms to the comparison function. This requirement has multiple drawbacks. The first drawback is large bandwidth typically forces the use of a dedicated receiver channel since the filtering and bandwidth requirements deviate significantly from those of the terminal receiver. Operating a dedicated receiver channel for the predistortion feedback path requires additional hardware which translates into additional cost and additional power dissipation.

The second drawback is that in order to digitize the feedback waveform which occupies five times the signal bandwidth, an analog-to-digital converter (ADC) 122 must be operated a high sample rate in order to avoid alias products. The power dissipation of an ADC is directly related to its sampling rate; therefore the addition of a high sample rate ADC to the feedback path adds a significant amount of power dissipation.

The third drawback is that in the classical digital predistortion architecture, the errors and distortion introduced by the feedback path receiver 120 will be induced into the forward waveform since these terms are not compensated. This means the feedback receiver must have very good EVM behavior over a bandwidth that is five times the signal bandwidth. This requirement often forces the use of digital equalization and digital intermediate frequency (IF) converter which involves the addition of more digital circuitry for signal processing and even higher ADC sample rates.

Therefore it becomes obvious that in order to perform a full digital predistortion using the classic architecture, it is virtually impossible to achieve an overhead power dissipation of less than 100 mWatts given the stringent requirements on the digital, mixed signal, and analog sections of the feedback path.

Figure 2:
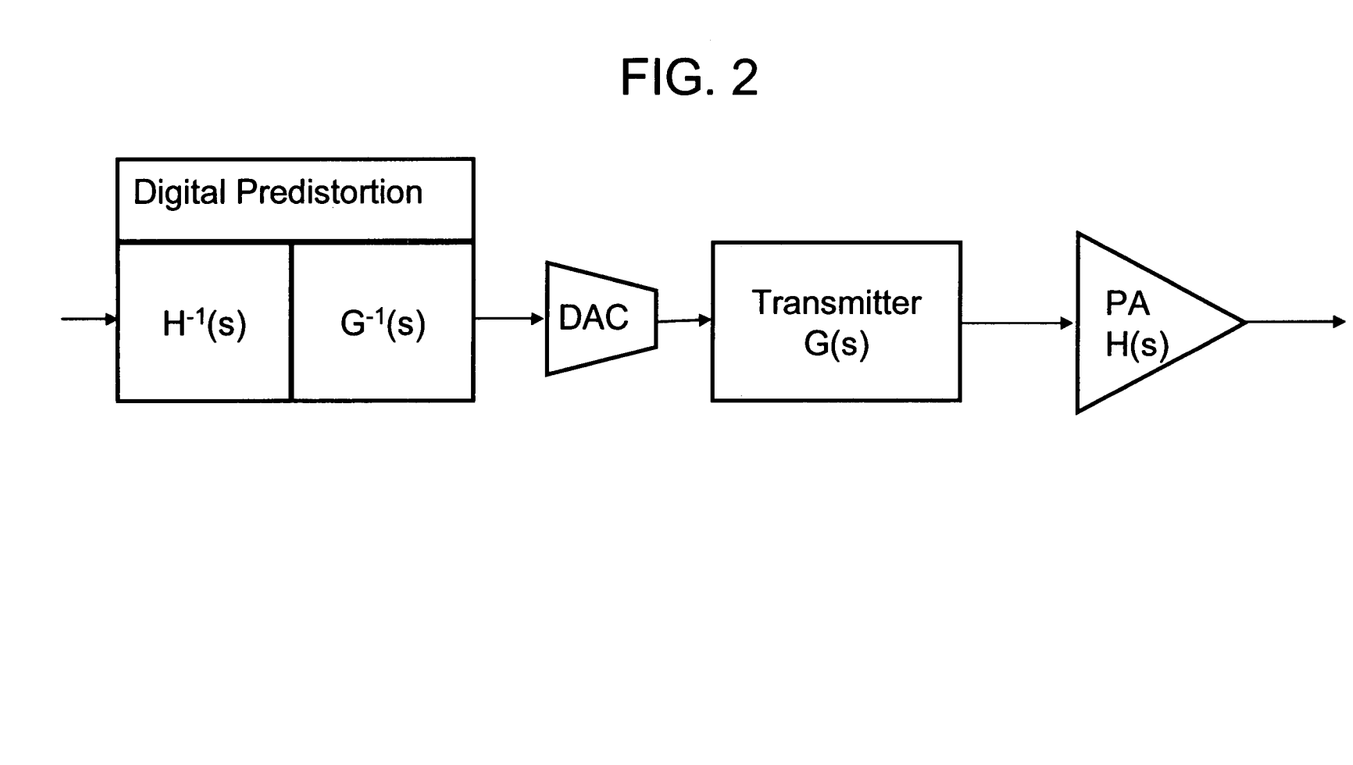
FIG. 2 schematically illustrates a contemporary open-loop predistortion architecture.

In order to tailor a predistortion architecture for an extremely low overhead power dissipation, it is necessary to reduce or eliminate the high bandwidth and low EVM requirements on the feedback path. Some forms of open loop predistortion have been proposed that fully eliminate the feedback requirements as represented in FIG. 2. The effectiveness of predistortion without any feedback is, however, very poor. It becomes obvious why this form of predistortion is so poor when one considers that the digital predistortion is added in the baseband which is the early transmitter stage, whereas the PA distortion occurs in the final transmitter stage. The power amplifier distortion appears at the power amplifier output, yet the inverse of the power amplifier distortion terms is added in baseband. Since there is often 50 dB to 60 dB of gain between the baseband and the power amplifier output, small errors in the baseband compensation result in large errors at the power amplifier output. Therefore there is a large transfer function, $G(s)$, between the predistortion block and the power amplifier that is multiplicative in its affect on the predistortion characteristics and is not fixed in its characteristics. In effect, the baseband predistortion transfer function is the inverse transfer function of the power amplifier distortion characteristics multiplied by the inverse transfer function of the transmitter and power amplifier gain.

Clearly, the gain of the transmitter and power amplifier can vary by up to +/−5% to +/−10% over the extremes of the temperature range to which the terminal is subjected. Over this operating temperature range, the output compression characteristics of the power amplifier may also vary. In addition, the gain and compression characteristics of the transmitter and power amplifier may vary with device aging and bias or battery voltage changes. Then as the transmitter is tuned from one operating frequency to another, the transmitter and power amplifier will have additional variations in the gain and compression characteristics. Since an open loop approach to predistortion effectively assumes a fixed transmitter and power amplifier response, its distortion correction capability is very limited.

Figure 3:
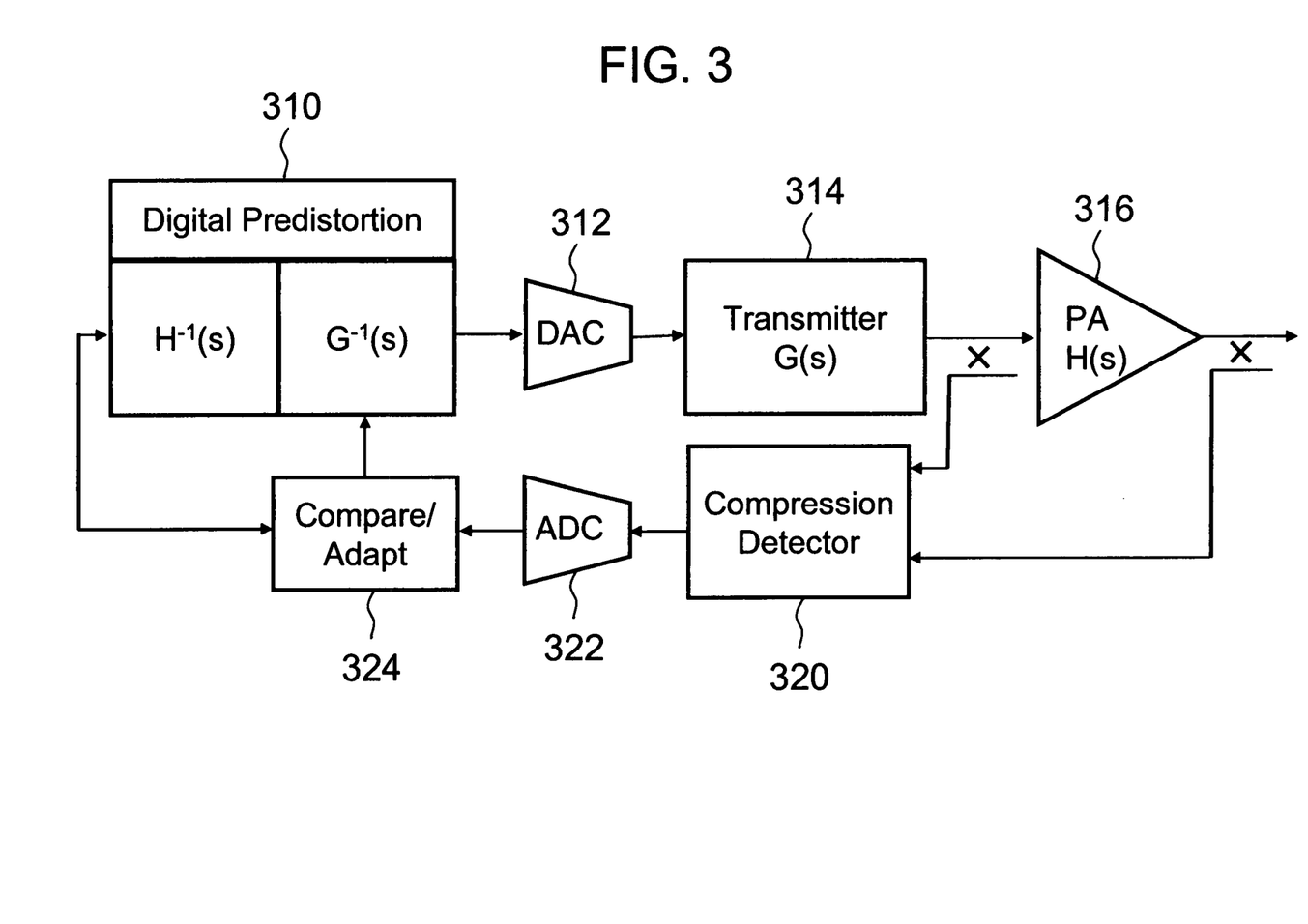
FIG. 3 schematically illustrates a diagram of a digital predistortion circuit architecture with compression detection feedback constructed as an embodiment according to the principles of the present invention.

In many digital predistortion approaches, an adaptation processor monitors the feedback path and compensates the predistortion transfer function to effectively adapt the predistortion for the gain and compression characteristic changes of the transmitter and power amplifier as well as other changes. A representative architecture is shown in FIG. 1. As an alternative, as shown in FIG. 3, the present invention seeks to detect the gain and compression curve changes of Transmitter 314 and Power Amplifier 316 and to digitally compensate the signal gain in order to keep the compression characteristics at the power amplifier output aligned with the inverse characteristics of a fixed predistortion transfer function in Digital Predistortion block 310. This is accomplished by calibrating a reference compression response in Compare and Adapt block 324 and by calibrating the correct predistortion response in Digital Predistortion block 310 at the same operating point in terms of temperature and frequency. Compression Detector 320 generates a compression indication that is digitized by ADC 322. During the compression response calibration, a reference table, i.e., a compression calibration table, of compression detector output values corresponding to baseband in-phase (I) and quadrature (Q) sample magnitude is constructed and stored in a memory. Then during the transmitter operation, the output level of Compression Detector 320 is compared to that of compression response calibration table for corresponding baseband sample magnitudes. By determining the difference in the compression level, the circuit is able to detect any gain changes that have occurred since the calibration was performed and to then adjust the gain applied to the digitized signal waveform to compensate. This circuit will seek to ensure that the compression response of Power Amplifier (PA) 316 remains aligned with the compression calibration table.

This technique ensures that the gain component of the digital predistortion transfer function $G^{-1}(s)$ is adjusted appropriately to ensure the total predistortion transfer function, $H^{-1}(s) \times G^{-1}(s)$, remains well aligned with the compression response of the power amplifier. This technique is therefore able to be adapted to variations in the transmitter channel gain, PA gain, and upward or downward shifts in the AM/AM characteristics of the PA. This technique will not provide an accurate adaptation to variations in the power amplifier AM/PM characteristics, variation in its memory characteristics, or AM/AM curve changes. Yet since a large percentage of transmitter and PA variations that drive the need for adaptation in the predistortion response are due to the transmitter and PA gain variations and the power amplifier AM/AM curve offset, this technique will still provide effective adaptation of the predistortion response.

Figure 4:
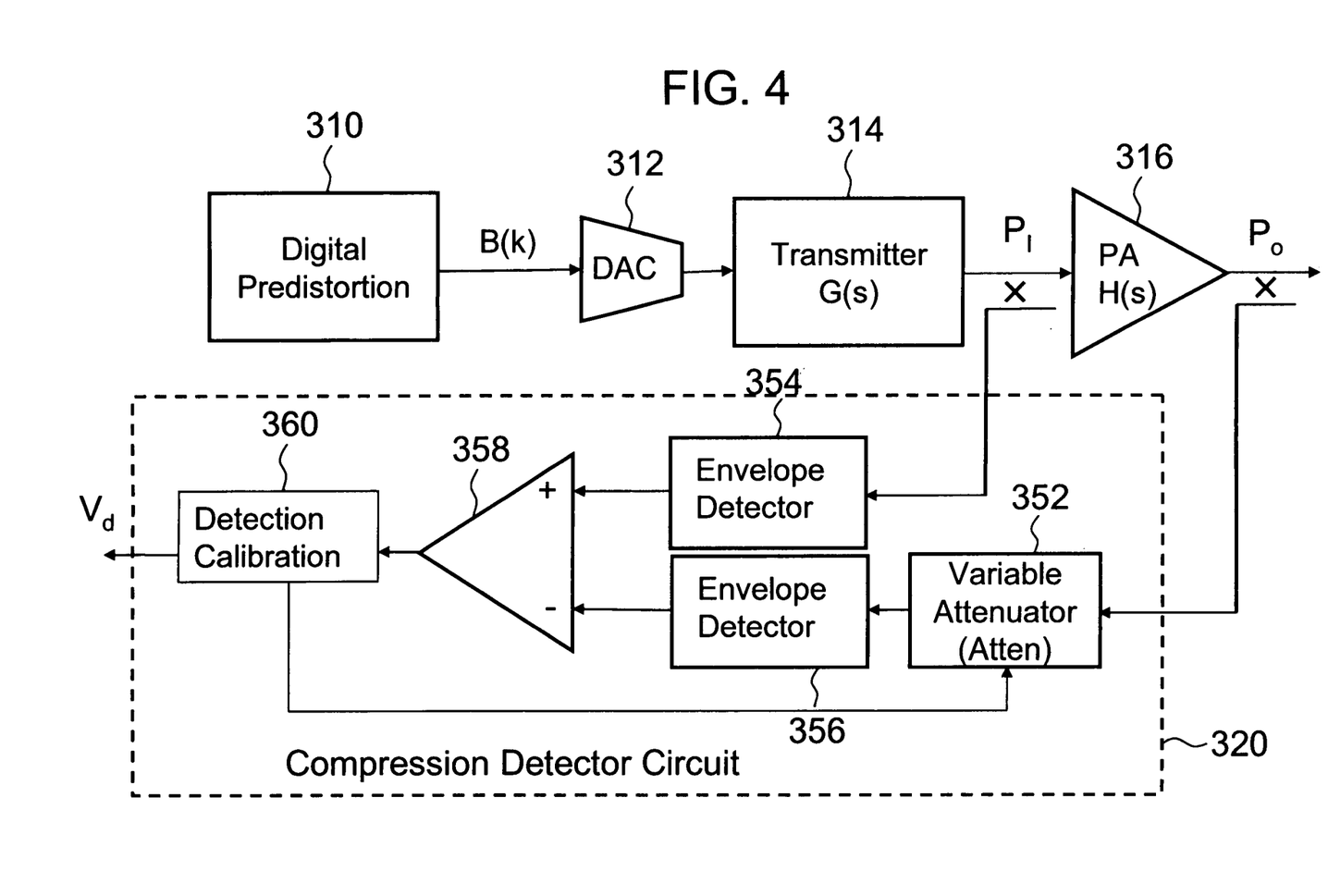
FIG. 4 schematically illustrates a compression detector diagram constructed as an embodiment according to the principles of the present invention.

The advantage of this form of predistortion adaptation is in the greatly simplified feedback mechanism. Rather than providing a complete wideband downconversion of the sampled signal from the power amplifier output, a simple compression detector circuit is used. FIG. 4 schematically illustrates a more detail diagram of this compression detector. Compression detector 320 is constructed with an envelope detector circuit 354 that operates using a sampled signal from the input signal $P_I$ of power amplifier 316. Note that the sampled signal is generated in such a way that a small percentage of the radio frequency (RF) signal (e.g. the input signal $P_I$) is coupled off as a sample of the RF signal. The output signal $P_O$ of power amplifier 316 is sampled and conditioned by a variable attenuator 352 for level adjustment. The output of variable attenuator 352 is fed to envelope detector 356. In circuit operation, the attenuation factor of variable attenuator 354 would be adjusted to be equal to the amount of gain of power amplifier 316 such that the input signal levels to envelope detectors 354 and 356 are essentially equal. Envelope detectors 354 and 356 output signals that are proportional to the amplitude envelope of their respective input waveforms, and thereby eliminating the RF carrier. Common implementations of an envelope detector circuit employ a diode and capacitor circuit. Such an embodiment in this circuit could be implemented using a diode pair for the diodes of envelope detectors 354 and 356 such that the detection and temperature characteristics would be very closely matched.

The output of envelope detectors 354 and 356 are provided to the input of a difference amplifier 358. A closed-loop calibration of the compression detector circuit is performed to ensure that the output of difference amplifier 358 is at a zero-compression indication level of $V_{ref}$ when power amplifier 316 is not operating in a compression region. An ideal amplifier would be a totally linear device, but real amplifiers are only linear within certain practical limits. When the signal drive to the amplifier is increased, the output also increases until a point is reached where some part of the amplifier becomes saturated and cannot produce any more output; this results in distortion. $V_{ref}$ can be either zero volts or some other DC voltage that represents a reference level indicating that power amplifier 316 is not operating in compression. The function of Detection Calibration block 360 is to adjust the attenuation factor of variable attenuator 352 to ensure that the input signal levels to envelope detectors 354 and 356 are essentially equal in power when power amplifier 316 is operating in its linear region. In one embodiment, Detection Calibration block 360 operates in a continuous calibration mode in which Detection Calibration block 360 detects the no-compression or linear range operation and adjusts the variable attenuator to keep the output $V_d$ at $V_{ref}$. In another embodiment, the calibration circuit operates only when a known reference signal having low enough power that power amplifier 316 does not compress passes through power amplifier 316. In this mode, variable attenuator 352 is adjusted to provide an output at $V_{ref}$ and is then fixed at that setting. By performing a continuous calibration, this circuit is able to distinguish compression behavior from gain variation (i.e., linear range) behavior. This avoids reliance on direct detection of gain variations that would be performed by comparing the envelope of the output of DAC 312 with the envelope of the output of power amplifier 316. This form of detection would be subject to large uncertainties and would also be incapable of including detection of compression curve shifts in the closed loop adaptation of the transmitter gain.

Figure 5:
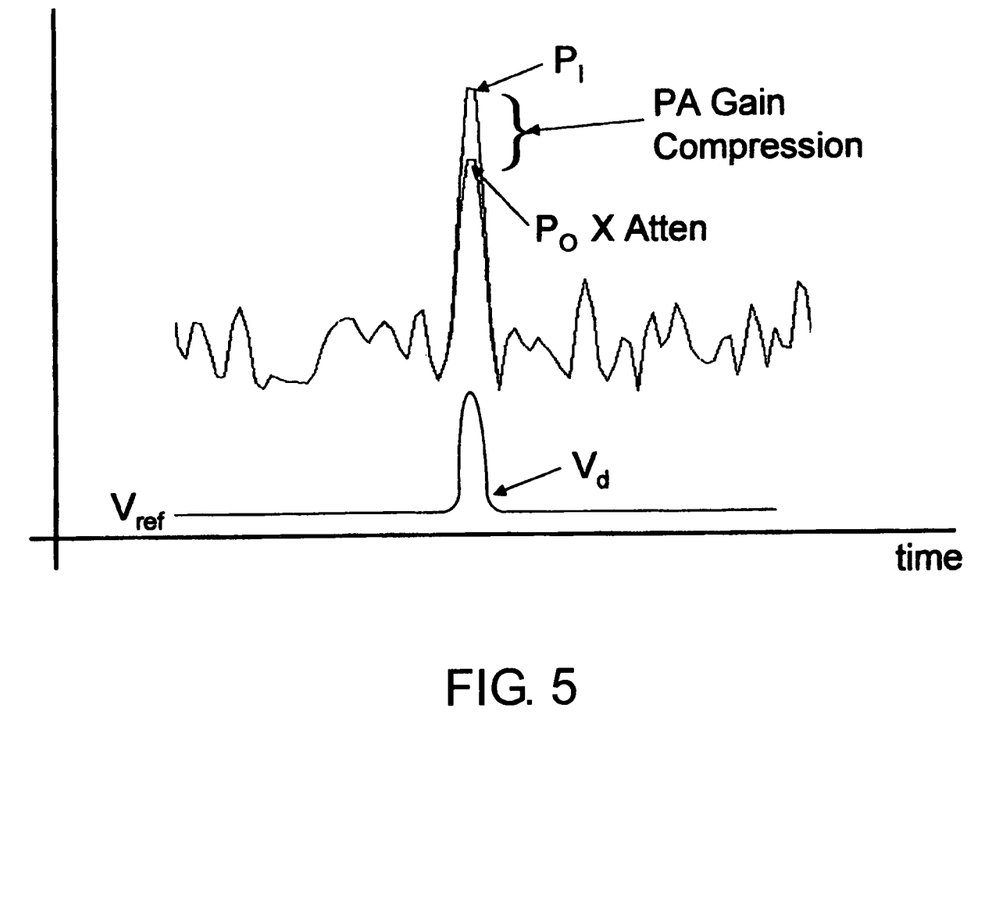
FIG. 5 illustrates a diagram of an example time domain compression detector response versus time.

FIG. 5 illustrates the expected operation of this compression detector circuit. The upper lines labeled "$P_I$" and "$P_O \times$ Atten" represent the outputs of envelope detectors 354 and 356, respectively, and the lower line labeled "Vd" represents the calibrated output of the entire compression detector circuit. When power amplifier 316 is operating within its linear region, the envelopes of $P_I$ and $P_O \times$ Atten will be nearly equal, and therefore outputs of envelope detectors 354 and 356 will be nearly equal, thereby resulting in a $V_{ref}$ level indication from difference amplifier 358 when variable attenuator 352 has been adequately calibrated to the correct setting. When the input signal power level of power amplifier 316 is high enough to cause a compression in power amplifier 316, the output level of envelope detector 356 will be less than that of 354, thereby resulting in an output pulse from difference amplifier 358 and from the entire compression detector circuit.

Figure 6:
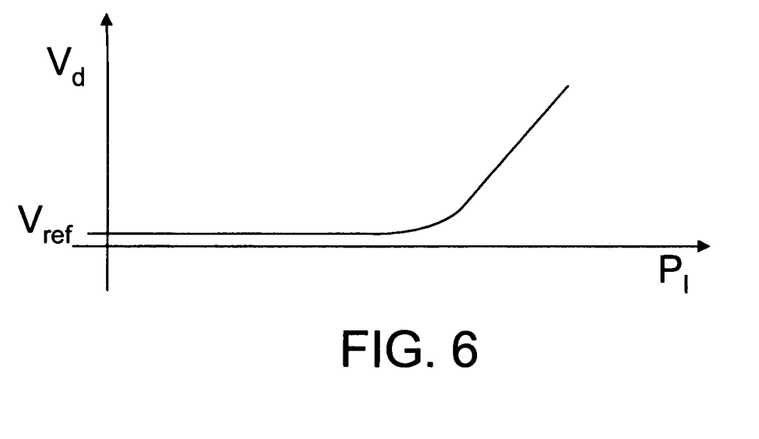
FIG. 6 illustrates a diagram of compression detector transfer function versus input signal power.

The compression detector circuit will have a transfer function described by FIG. 6. The output of the compression detector circuit, $V_d$, will have a response to the envelope of the input signal power $P_I$ of power amplifier 316, as shown in FIG. 6. For small signal operation in which power amplifier 316 is operating in its linear region, $V_d$ will be at the level of $V_{ref}$. As the input signal $P_I$ increases and power amplifier is driven into the compression region, the output voltage of the compression detector will increase. This curve is essentially the inverse of the power amplifier gain response relative to its input power level.

Figure 7:
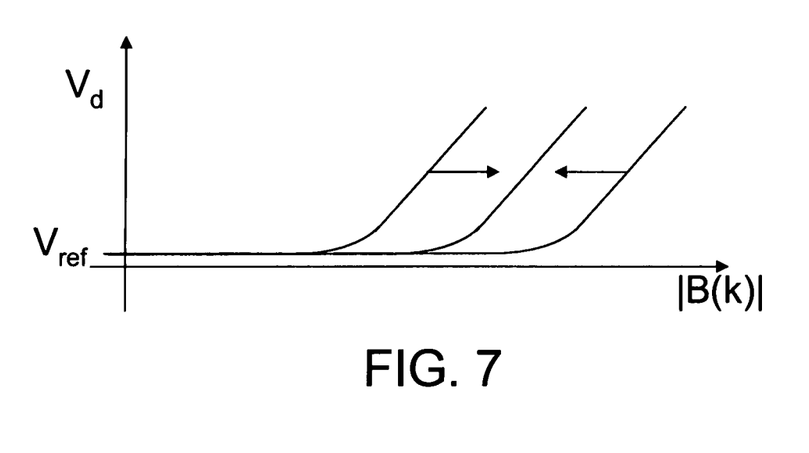
FIG. 7 schematically illustrates impacts of transmitter gain variation on compression detector output versus baseband magnitude.

As the gain of the Radio Frequency Integrated Circuit (RFIC) transceiver chain varies with temperature or other effects, the power of input signal to power amplifier 316 varies relative to the magnitude of the baseband digital sample, B(k), at the input of DAC 312. Consequently, the transfer function of $P_I$ to $V_d$ will shift as the gain and compression characteristics of the power amplifier vary with temperature or other effects. Likewise, the transfer function of |B(k)| to $V_d$ will shift as shown in FIG. 7. For example, as the gain of the transceiver increases, the curve of FIG. 7 will shift to the left; and conversely as the gain decreases, the curve will shift to the right. A similar result will be encountered as the gain or compression characteristics of the power amplifier increase or decrease. Therefore, by measuring the typical room temperature transfer response of |B(k)| versus $V_d$, by storing this response as a reference, and by continually comparing the transfer response of |B(k)| versus $V_d$ with the reference transfer response, it is then possible to detect changes in the transceiver or power amplifier gain or compression characteristics. This invention then implements a closed-loop control mechanism that seeks to keep transfer response of |B(k)| versus $V_d$ nearly equal to the reference response that is stored by adjusting the signal gain in order to keep the compression characteristics used by the predistortion block well aligned with the power amplifier output signal level and compression behavior.

Figure 8:
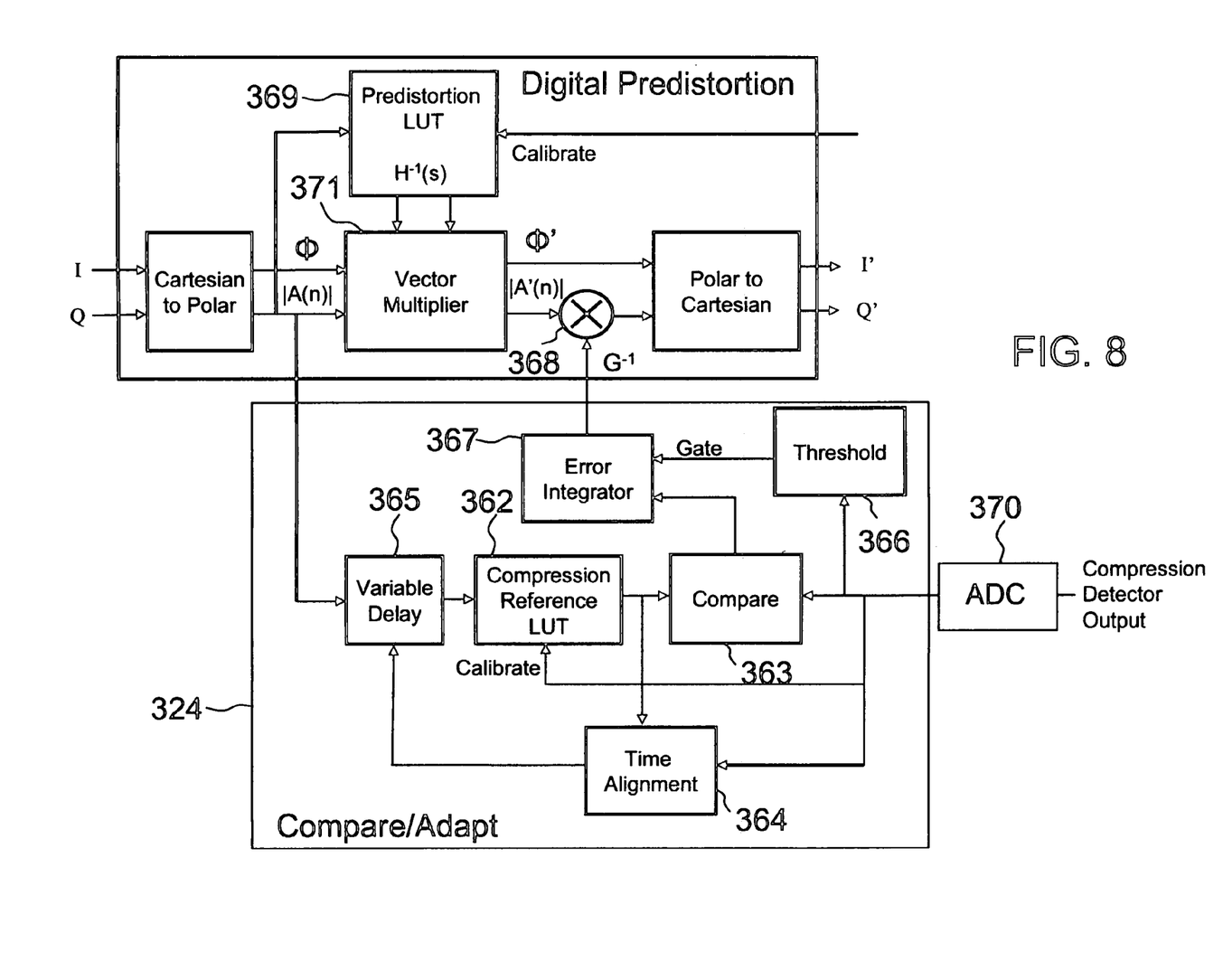
FIG. 8 schematically illustrates a compare and adapt circuit diagram constructed as one embodiment according to the principles of the present invention.

Compare and Adapt block 324 performs the closed-loop control function as represented in FIG. 8. In this block, the output of the compression detector is digitized by an analog-to-digital converter (ADC) 370. During the calibration of the transfer function of |B(k)| versus $V_d$, the response of the compression detector is captured and stored in Compression Reference Look-up Table (LUT) 362. For each value of the magnitude of the Cartesian digital samples provided to DAC 312, |B(k)|, a corresponding value of digitized $V_d$ will be stored. Each magnitude sample |A(n)| of the original complex baseband digital sample after Cartesian to polar conversion but prior to predistortion will be delayed by an amount equal to the delay time through the transceiver and compression detector. Then during normal circuit operation, Compression Reference LUT 362 will output a reference compression indication that corresponds to a different corresponding sample |A(n)|. The output of ADC 370 will be compared to the output of Compression Reference LUT 362 and a difference value will be generated at the output of Compare block 363.

During the calibration sequence, a test waveform containing a time alignment pulse will pass through the system. The pulse will enable Time Alignment block 364 to set the value of Variable Delay 365 by comparing the output of Compression Reference LUT 362 to the output of ADC 370. Once this time alignment calibration is completed, Variable Delay block 365 will be set to an appropriate delay value. Time Alignment block 364 setting can be operated either only during a calibration cycle or during a factory calibration process if negligible time delay drift is expected. The time alignment calibration could alternately be operated as on-going calibration during normal operation if some problematic amount of delay drift is expected.

When the output of ADC 370 is time aligned with the output of Compression Reference LUT 362, Compare block 363 will produce an error signal that represents the difference between the output of Compression Detector and the reference response, on a sample-by-sample basis. When the waveform level is within the linear range of the power amplifier, the output of Compare 363 will indicate no error or a zero value output. When the waveform has a peak that is high enough to drive the power amplifier to operation in the compression region and to generate a voltage of $V_d$ that exceeds $V_{ref}$, Compare block 363 will produce an error signal indicating that some amount of gain deviation has occurred since Compression Reference LUT 362 was calibrated. For example, if the gain of the transceiver or power amplifier has drifted higher, the $V_d$ response at a waveform peak will be greater than the compression reference transfer function. In this event, Compare block 363 would generate a negative error value. This negative error value could either be a binary negative indication or could be a value that is scaled to the amount of difference between the two inputs of Compare block 363. By integrating this error value using Error Integrate block 367, the average error will be accumulated. This integrated error value will then be used to control the gain multiplier $G^{-1}$ to scale the signal amplitude downward in multiplier block 368.

Conversely, if the gain of the transceiver or power amplifier has drifted lower, the $V_d$ response at a waveform peak will be less than the compression reference transfer function. In this event, Compare block 363 would generate a positive error value. This positive error value could either be a binary positive indication or could be a value that is scaled to the amount of difference between the two inputs of Compare block 363. By integrating this error using Integrate block 367, the average error will be accumulated. This integrated error value will then be used to control the gain multiplier $G^{-1}$ to scale the signal amplitude upward in multiplier block 368. By this closed-loop means, the fixed AM/AM and AM/PM correction characteristics stored within Predistortion LUT 369 will continue to be largely aligned with the compression characteristics of the output of power amplifier 316.

It is expected that some residual noise will be generated on the $V_d$ signal at low signal level conditions due to noise, residual circuit non-linearities, envelope detector differences, and difference amplifier imperfections. To prevent this noise from affecting the output of Error Integrator 367, a Threshold block 366 can be added. The function of this block is to detect whether the output of ADC 370 exceeds a predetermined threshold value. When this predetermined threshold value is exceeded, Error Integrator 367 is allowed to integrate the error signal from Compare block 363. When the output of ADC 370 is below the threshold value, Error Integrator 367 is frozen such that the error signal from Compare block 363 is ignored and the output of Error Integrator block 367 is held at a constant value.

Figure 9:
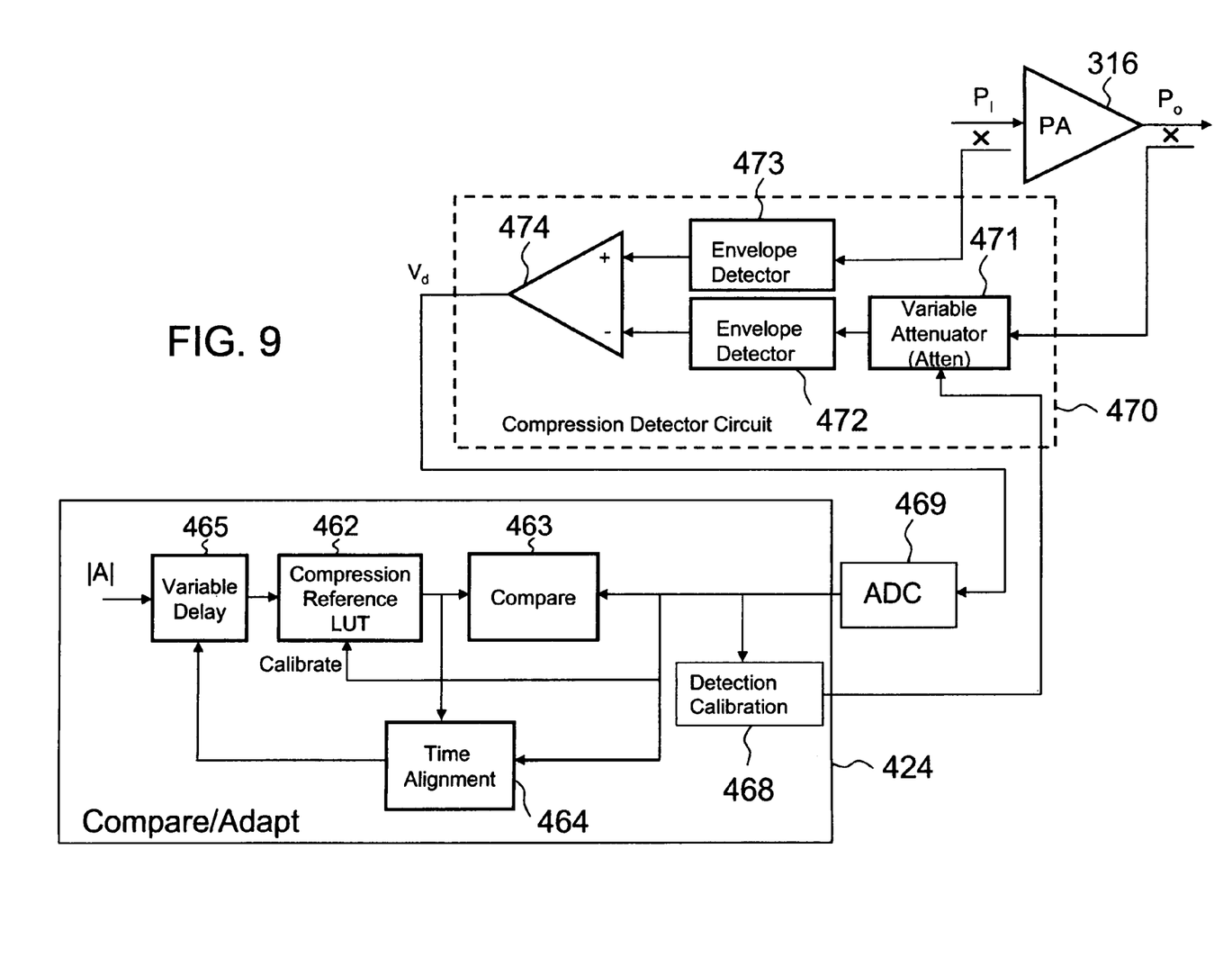
FIG. 9 schematically illustrates a compare and adapt circuit diagram constructed as another embodiment according to the principles of the present invention.

An alternate embodiment according to the principles of the present invention is shown in FIG. 9. In this embodiment, Detection Calibration block 468 is contained in Compare and Adapt block 424 rather than Compression Detector block 470, and is implemented digitally. In this embodiment, Detection Calibration block 468 reads the digitized compression detector output from ADC 469, compares the output level with a digital reference level of $V_{ref}$, and adjusts the attenuation value of Variable Attenuator 471 to ensure that the output of Compression Detector 470 is set to $V_{ref}$ when power amplifier 316 is operating within its linear range.

As part of the calibration process, Predistortion LUT 369 shown in FIG. 8 is loaded with the inverse of the power amplifier AM/AM and AM/PM characteristics. The power amplifier AM/AM and AM/PM characteristics are represented by a set of correction values. These characteristics can be measured by external test equipment and loaded directly into Predistortion LUT 369. Table 1 is an example showing a table of AM/AM and AM/PM correction values. The entries of the AM/AM and AM/PM correction values are indexed by the polar amplitude samples. The AM/AM correction values are multiplication factors that would be multiplied by the corresponding polar amplitude samples. The AM/PM correction values are phase offsets to be added to the phase component of the signal sample depending on the signal amplitude.

TABLE 1

An example table of AM/AM and AM/PM characteristics

| Polar Amplitude Sample | AM/AM correction value | AM/PM correction value |
|---|---|---|
| 1 | 1 | 0° |
| 2 | 1 | 0° |
| 3 | 1 | 0° |
| 4 | 1 | 0° |
| 5 | 1 | 0° |
| 6 | 1.0167 | 1° |
| 7 | 1.0429 | 2° |
| 8 | 1.0750 | 3° |
| 9 | 1.1111 | 4° |

Then during system operation, the appropriate AM/AM and AM/PM correction values will be indexed from Predistortion LUT 369 using the amplitude sample A(n). The indexed complex correction value is multiplied by the sample A(n) in Vector Multiplier 371. Alternately, an observation path receiver may be provided to sample the power amplifier output and a correction algorithm could be used to load Predistortion LUT 369 with the appropriate correction values. Yet the key benefit of this predistortion approach is that it can largely eliminate the need for an observation path receiver by allowing a fixed predistortion transfer function $H^{-1}(s)$ to be determined by external test equipment and to be then loaded into Predistortion LUT 369. Then the gain of the transceiver will be controlled by Compare and Adapt block 324 to keep the transceiver and power amplifier gain and compression characteristics aligned with the inverse AM/AM and AM/PM response $H^{-1}(s)$ in Predistortion LUT 369. Note that the architecture of Digital Predistortion block 310 shown in FIG. 8 is only an example for the predistortion block. The present invention, however, does not limit the architecture of the digital predistortion block, as long as there is a gain multiplier $G^{-1}$ to scale the signal amplitude downward.

The calibration procedure for this complete predistortion solution involves four individual calibration steps. The first step is to calibrate Predistortion LUT block 369 to ensure Predistortion LUT block 369 contains the correct inverse AM/AM and AM/PM correction values for a reference condition. The reference condition is likely to be at nominal bias or battery voltages and room temperature, although other conditions may be defined for the reference condition.

The second calibration step is to calibrate Detection Calibration block 360 to ensure that the output of Compression Detector Circuit 320 is at the reference level of $V_{ref}$ when the power amplifier is operated in its linear region. This calibration step is expected to be performed as a factory calibration of the entire device constructed with the power amplifier, but this calibration step can also be performed as an on-going calibration process during system operation to ensure Compression Detector Circuit 320 remains in balance.

The third calibration step is to calibrate Compression Reference LUT 362. The calibration is performed under the same reference conditions that Predistortion LUT 369 is calibrated. Compression Reference LUT 362 is calibrated using a waveform that emulates the entire dynamic range of the transceiver and power amplifier. Essentially, the response of Compression Detector Circuit 320 is detected and stored into Compression Reference LUT 362 for each value of A(n) throughout the dynamic range. Alternately, Compression Detector LUT 362 may store the responses for values of A(n) that exceed $V_{ref}$. Below a certain level of A(n), no power amplifier compression will occur and since the $V_{ref}$ value should be generated for these A(n) values; therefore it is only necessary to calibrate and store the range of A(n) that produces corresponding values greater than $V_{ref}$. Using this means, the size of Compression Detector LUT 362 can be greatly reduced since Compression Detector LUT 362 only needs to cover the range over which the power amplifier compresses. For example, if A(n) is a 12 bit value, Compression Detector LUT 362 would need to contain 4096 entries if calibrated for the entire dynamic range. If power amplifier compression only occurs in the upper 256 entries, the size of Compression. Detector LUT 362 can be reduced to store $V_d$ reference levels corresponding to the upper 256 A(n) values.

The fourth calibration step is to calibrate Variable Delay block 365 of Compare and Adapt block 324 using Time Alignment block 364. This calibration is performed using a waveform that contains a high level pulse that drives the power amplifier into compression. This allows Variable Delay block 365 to be adjusted or fine tuned to align the response of Compression Reference LUT 362 with the output of ADC 370. This calibration is expected to be done as a factory calibration of the entire device, but it can also be conducted as an on-going calibration during system operation to compensate for possible drifts in delay through the transceiver, power amplifier, and compression detection circuit with time and temperature.

This invention disclosure describes a method of power amplifier predistortion that makes use of a compression detector circuit in a feedback loop in order to adapt the channel gain for changing transmitter behavior. Rather than continuously adapting the predistortion correction function to compensate for changes in transceiver and power amplifier gain and compression characteristics with time, temperature, and bias voltage, this method keeps the predistortion correction function constant yet seeks to instead compensate the total system gain. By monitoring the compression behavior of the amplifier, the signal is scaled to compensate for gain and compression point variations in the power amplifier and transmitter without the need to sample, fully downconvert, and detect the power amplifier output waveform along with its third and fifth order intermodulation products. The advantage of this technique is that no wide bandwidth receiver downconverter is needed and the analog-to-digital converter (ADC) bandwidth required for the feedback path is not greater than the transmit signal bandwidth. Instead a low speed, simple envelope detection approach is used to detect the gain changes and then adapt the gain in a closed loop method. While some form of adaptation is necessary in order to maintain the effectiveness of the predistortion, a low bandwidth adaptation of the transceiver gain using a simple yet accurate envelope detection approach will provide much lower power consumption and resource requirements that a wide bandwidth detection and adaptation of the predistortion correction function.

The primary advantage of this invention is that it allows for a form of closed loop adaptation that requires only limited hardware resources and low bandwidth for the feedback path. By detecting changes in the transmitter and power amplifier gain and compression characteristics, this form of feedback allows for adaptation to first order degradations of the predistortion accuracy which is mainly due to gain variations and compression variations in the transceiver and power amplifier. The actual predistortion correction characteristics are expected to be determined during a factory calibration and are fixed in a memory LUT. Instead of adapting the predistortion correction table using a wideband feedback path to compensate for transceiver and power amplifier variations with time, temperature, and bias voltage, this technique keeps the predistortion correction table constant and instead adapts the digital gain to compensate for these variations. This makes this form of feedback well suited to low power, low cost applications such as cellular phones, broadband wireless access points, and wireless LAN terminals.

For low power applications such as cellular phones, the power consumption of full wideband observation receiver used to continuously adapt the predistortion correction table is not practical. Implementation of the actual predistortion correction doesn't require a significant number of additional resources nor does it require a significant amount of additional power consumption. It is primarily the predistortion correction adaptation that requires a large amount of additional hardware resources and power consumption.

Therefore by keeping the predistortion correction constant and by simply adjusting the forward path gain to keep the predistortion correction characteristics aligned with the power amplifier output, it is possible to eliminate a large percentage of the transceiver and power amplifier changes with time, temperature, and bias voltage that would otherwise require an adaptation of the predistortion correction in order to maintain its accuracy and effectiveness. In order to make appropriate gain compensation, the compression detection approach provides a low resource and low power approach to detect and adjust the gain in a closed-loop means to ensure the predistortion correction remains appropriately aligned. This compression detection approach can be implemented using a relative few integrated circuit gates and can operate at a relatively low speed to maintain low power dissipation and require only a low sample-rate ADC.

These advantages of a low power, low resource means of compensating a predistortion block to adapt for transceiver and power amplifier variations make this approach very well suited for low cost, low power wireless applications that require predistortion in order to enhance transmitted waveform error vector magnitude (EVM) and enhanced power amplifier efficiency. This ensure that the power amplifier efficiency improvement gained through lower back-off operation in order to transmit at the required waveform EVM and ACPR will not lost in excessive power consumption of a wideband predistortion adaptation receiver. Likely applications of this approach are low power terminal applications used in wireless systems that use waveforms having high peak-to-average (PAR) ratio, yet require very low EVM. Examples of these systems are WiMax, WiBro, LTE, and other OFDM based systems. Other possible applications are CDMA and WCDMA systems.

While the invention has been shown and described in connection with the preferred embodiments, it will be apparent to those skilled in the art that modifications and variations can be made without departing from the spirit and scope of the invention as defined by the appended claims.

What is claimed is:

1. A circuit for amplifying signals, comprising:
a predistortion circuit distorting an input signal in dependence upon a predistortion correction value selected from a plurality of predistortion correction values stored in a look-up table (LUT), and adjusting the distorted signal in dependence upon a variation of circuit characteristics;
a transceiver circuit coupled to receive the output signal from the predistortion circuit and processing the received signal in dependence upon a certain transceiver transfer function;
an amplification circuit coupled to receive the output signal from the transceiver circuit and amplifying the signal in dependence upon an amplification transfer function;
a compression detector circuit coupled to receive the amplified signal output from the amplification circuit and a signal from an input signal of the amplification circuit, detecting whether the amplification circuit is operating in a compression mode, and generating a compression indication signal; and
a compare and adapt circuit coupled to receive the compression indication signal, controlling the predistortion circuit for controlling the adjustment of the distorted signal in dependence upon the received compression indication signal.

2. The circuit of claim 1, comprised of the compression detector circuit comprising:
a first envelope detector circuit coupled to receive a first sampled signal from the input signal of the amplification circuit and generating a first envelope signal;
a variable attenuator circuit coupled to receive a second sampled signal from the output signal of the amplification circuit and attenuating the received second sampled signal in dependence upon an attenuation factor;
a second envelope detector circuit coupled to receive the attenuated signal and generating a second envelope signal; and
a difference amplifier circuit coupled to receive both the first envelope signal and the second envelope signal and outputting the compression indication signal in dependence upon the difference of the first envelope signal and the second envelope signal.

3. A circuit for amplifying signals, comprising:
a predistortion circuit distorting an input signal in dependence upon a predistortion correction value selected from a plurality of predistortion correction values stored in a look-up table (LUT), and adjusting the distorted signal in dependence upon a variation of circuit characteristics;
a transceiver circuit coupled to received the output signal from the predistortion circuit and processing the received signal in dependence upon a certain transceiver transfer function;
an amplification circuit coupled to receive the output signal from the transceiver circuit and amplifying the signal in dependence upon an amplification transfer function;
a compression detector circuit coupled to the amplification circuit, detecting whether the amplification circuit is operating in a compression mode, and generating a compression indication signal, the compression detector circuit comprising:
a first envelope detector circuit coupled to receive a first sampled signal from the input signal of the amplification circuit and generating a first envelope signal,
a variable attenuator circuit coupled to receive a second sampled signal from the output signal of the amplification circuit and attenuating the received second sampled signal in dependence upon an attenuation factor,
a second envelope detector circuit coupled to receive the attenuated signal and generating a second envelope signal,
a difference amplifier circuit coupled to receive both the first envelope signal and the second envelope signal, and generating the compression indication signal in dependence upon the difference between the first envelope signal and the second envelope signal,
a detection calibration circuit coupled to receive the compression indication signal, and controlling the variable attenuator circuit to adjust the attenuation factor in dependence upon the received compression indication signal, in order to maintain the attenuated signal to be equal to the first sampled signal when the amplification circuit is not operating in a compression mode; and a compare and adapt circuit coupled to receive the compression indication signal, controlling the predistortion circuit for controlling the adjustment of the distorted signal in dependence upon the received compression indication signal.

4. The circuit of claim 3, comprised of the detection calibration circuit controlling the variable attenuator circuit continuously.

5. The circuit of claim 3, comprised of the detection calibration circuit controlling the variable attenuator circuit only when a reference signal is input into the amplification circuit.

6. The circuit of claim 3, comprised of the compare and adapt circuit comprising:
an analog-to-digital converter circuit coupled to receive the compression indication signal and outputting a sequence of compression indication samples;
a variable delay circuit coupled to receive a sequence of amplitude samples of the input signal, and delaying the amplitude samples by a certain amount;
a compression reference look-up table storing amplitude values and corresponding reference compression indication values, coupled to receive the delayed amplitude samples and outputting a sequence of reference compression indication samples;
a time alignment circuit coupled to receive both of the sequence of reference compression indication samples and sequence of compression indication samples, and controlling the variable delay circuit by comparing the reference compression indication samples with the corresponding compression indication samples;
a compare circuit coupled to both of the sequence of reference compression indication samples and sequence of compression indication samples, and generating a sequence of error values representing the differences between the corresponding reference compression indication samples and the corresponding compression indication samples; and
an error integration circuit coupled to receive the sequence of error values, integrating the error values, and outputting a sequence of integrated error values.

7. The circuit of claim 6, further comprising a threshold circuit coupled to sequentially receive the compression indication samples, controlling the error integration circuit to ignore the input error values whenever the compression indication sample exceeds a certain threshold value.

8. A circuit for amplifying signals, comprising:
a predistortion circuit distorting an input signal in dependence upon a predistortion correction value selected from a plurality of predistortion correction values stored in a look-up table (LUT), and adjusting the distorted signal in dependence upon a variation of circuit characteristics, the predistortion circuit comprising:
a Cartesian to polar conversion circuit coupled to receive the input signal and converting the received input signal into a sequence of amplitude samples,
a predistortion look-up table storing amplitude sample values and corresponding predistortion correction values, coupled to sequentially receive the amplitude samples and outputting the corresponding sequence of predistortion correction values,
a vector multiplier circuit coupled to sequentially receive the amplitude samples and the predistortion correction values and outputting a sequence of distorted amplitude samples,
a multiplier circuit coupled to receive the sequence of distorted amplitude samples and a sequence of integrated error values from the compare and adapt circuit, multiplying the distorted amplitude samples with the corresponding integrated error values, and outputting a sequence of corrected amplitude samples, and
a polar to Cartesian circuit coupled to convert the sequence of corrected amplitude samples;
a transceiver circuit coupled to receive the output signal from the predistortion circuit and processing the received signal in dependence upon a certain transceiver transfer function;
an amplification circuit coupled to receive the output signal from the transceiver circuit and amplifying the signal in dependence upon an amplification transfer function;
a compression detector circuit coupled to the amplification circuit, detecting whether the amplification circuit is operating in a compression mode, and generating a compression indication signal; and
a compare and adapt circuit coupled to receive the compression indication signal, controlling the predistortion circuit for controlling the adjustment of the distorted signal in dependence upon the received compression indication signal.

9. A method for amplifying signals, the method comprising the steps of:
distorting, at a predistortion circuit, an input signal in dependence upon a predistortion correction value selected from a plurality of predistortion correction values stored in a look-up table (LUT), and adjusting the distorted signal in dependence upon a variation of circuit characteristics;
processing, at a transceiver circuit, the output signal from the predistortion circuit in dependence upon a certain transceiver transfer function;
amplifying, at an amplification circuit, the signal in dependence upon an amplification transfer function;
detecting, at a compression detector circuit, whether the amplification circuit is operating in a compression mode based on a signal received from an input signal of the amplification circuit and the amplified signal output from the amplification circuit, and generating a compression indication signal; and
controlling, at a compare and adapt circuit, the predistortion circuit for controlling the adjustment of the distorted signal in dependence upon the received compression indication signal.

10. The method of claim 9, comprised of said step of detecting whether the amplification circuit is operating in a compression mode, and generating a compression indication signal comprising:
generating a first envelope signal, at a first envelope detector circuit, based on a first sampled signal from the input signal of the amplification circuit;
attenuating, at a variable attenuator circuit, a second sampled signal from the output signal of the amplification circuit in dependence upon an attenuation factor;
generating a second envelope signal, at a second envelope detector circuit, based on the attenuated signal; and detecting, at a difference amplifier circuit, the difference between the first envelope signal and the second envelope signal, and outputting the compression indication signal.

11. A method for amplifying signals, the method comprising the steps of:
  distorting, at a predistortion circuit, an input signal in dependence upon a predistortion correction value selected from a plurality of predistortion correction values stored in a look-up table (LUT), and adjusting the distorted signal in dependence upon a variation of circuit characteristics;
  processing, at a transceiver circuit, the output signal from the predistortion circuit in dependence upon a certain transceiver transfer function;
  amplifying, at an amplification circuit, the signal in dependence upon an amplification transfer function;
  detecting, at a compression detector circuit, whether the amplification circuit is operating in a compression mode, and generating a compression indication signal, wherein detecting whether the amplification circuit is operating in a compression mode, and generating a compression indication signal comprises:
    generating a first envelope signal, at a first envelope detector circuit, based on a first sampled signal from the input signal of the amplification circuit,
    attenuating a second sampled signal, at a variable attenuator circuit, from the output signal of the amplification circuit,
    generating a second envelope signal, at a second envelope detector circuit, based on the attenuated signal,
    detecting, at a difference amplifier circuit, the difference between the first envelope signal and the second envelope signal, and generating the compression indication signal, and
    controlling, at a detection calibration circuit, the variable attenuator circuit in dependence upon the received compression indication signal to maintain the attenuated signal to be equal to the first sampled signal when the amplification circuit is not operating in a compression mode; and
  controlling, at a compare and adapt circuit, the predistortion circuit for controlling the adjustment of the distorted signal in dependence upon the received compression indication signal.

12. The method of claim 11, comprised of the variable attenuator circuit being controlled continuously.

13. The method of claim 11, comprised of the variable attenuator circuit being controlled only when a reference signal is input into the amplification circuit.

14. The method of claim 11, comprised of said step of controlling the adjustment of the distorted signal in dependence upon the received compression indication signal comprising:
  converting, at an analog-to-digital converter circuit, the compression indication signal into a sequence of compression indication samples;
  delaying, at a variable delay circuit, a sequence of amplitude samples of the input signal by a certain amount;
  constructing a compression reference look-up table for storing amplitude values and corresponding reference compression indication values;
  receiving the delayed amplitude samples and outputting a sequence of reference compression indication samples in dependence upon the compression reference look-up table;
  controlling the variable delay circuit, at a time alignment circuit, by comparing the reference compression indication samples with the corresponding compression indication samples;
  generating, at a compare circuit, a sequence of error values representing the differences between the corresponding reference compression indication samples and the corresponding compression indication samples; and
  integrating, at an error integration circuit the error values, and outputting a sequence of integrated error values.

15. The method of claim 14, further comprising controlling, at a threshold circuit, the error integration circuit to ignore the input error values whenever the compression indication sample exceeds a certain threshold value.

16. The method of claim 14, comprised of said step of distorting an input signal and adjusting the distorted signal in dependence upon a variation of a circuit characteristics comprising:
  converting, at a Cartesian to polar conversion circuit, the input signal into a sequence of amplitude samples;
  constructing a predistortion look-up table for storing amplitude sample values and corresponding predistortion correction values;
  receiving the amplitude samples and generating the corresponding sequence of predistortion correction values in dependence upon the predistortion look-up table;
  multiplying, at a vector multiplier circuit, the amplitude samples with the corresponding predistortion correction values and outputting a sequence of distorted amplitude samples;
  multiplying, at a multiplier circuit, the distorted amplitude samples with corresponding integrated error values, and outputting a sequence of corrected amplitude samples; and
  converting, at a polar to Cartesian circuit, the sequence of corrected amplitude samples.

17. A circuit for amplifying signals, comprising:
  a predistortion circuit distorting an input signal in dependence upon a predistortion correction value selected from a plurality of predistortion correction values, and adjusting the distorted signal in dependence upon a variation of circuit characteristics;
  a transceiver circuit coupled to receive the output signal from the predistortion circuit and processing the received signal in dependence upon a certain transceiver transfer function;
  an amplification circuit coupled to receive the output signal from the transceiver circuit and amplifying the signal in dependence upon an amplification transfer function;
  a first envelope detector circuit coupled to receive a first sampled signal from the input signal of the amplification circuit and generating a first envelope signal;
  a variable attenuator circuit coupled to receive a second sampled signal from the output signal of the amplification circuit and attenuating the received second sampled signal in dependence upon an attenuation factor;
  a second envelope detector circuit coupled to receive the attenuated signal and generating a second envelope signal;
  a difference amplifier circuit coupled to receive both the first envelope signal and the second envelope signal and outputting a compression indication signal in dependence upon the difference of the first envelope signal and the second envelope signal; and
  a compare and adapt circuit coupled to receive the compression indication signal, controlling the predistortion circuit for controlling the adjustment of the distorted signal in dependence upon the received compression indication signal.

18. The circuit of claim 17, comprised of the compare and adapt circuit comprising:
an analog-to-digital converter circuit coupled to receive the compression indication signal and outputting a sequence of compression indication samples;
a detection calibration circuit coupled to receive the sequence of compression indication samples, and controlling the variable attenuator circuit to adjust the attenuation factor in dependence upon the received sequence of compression indication samples, in order to maintain the attenuated signal to be equal to the first sampled signal when the amplification circuit is not operating in a compression mode;
a variable delay circuit coupled to receive a sequence of amplitude samples of the input signal and delaying the amplitude samples by a certain amount;
a compression reference look-up table storing amplitude values and corresponding compression indication values, coupled to receive the delayed amplitude samples and outputting a sequence of reference compression indication samples;
a time alignment circuit coupled to receive both of the sequence of reference compression indication samples and sequence of compression indication samples, and controlling the variable delay circuit by comparing the reference compression indication samples with the corresponding compression indication samples;
a compare circuit coupled to both of the sequence of reference compression indication samples and sequence of compression indication samples, and generating a sequence of error values representing the differences between the corresponding reference compression indication samples and the corresponding compression indication samples; and
an error integration circuit coupled to receive the sequence of error values, integrating the error values, and outputting a sequence of integrated error values.

19. The circuit of claim 18, further comprising a threshold circuit coupled to sequentially receive the compression indication samples, controlling the error integration circuit to ignore the input error values whenever the compression indication sample exceeds a certain threshold value.

20. A method for amplifying signals, the method comprising the steps of:
distorting, at a predistortion circuit, an input signal in dependence upon a predistortion correction value selected from a plurality of predistortion correction values, and adjusting the distorted signal in dependence upon a variation of circuit characteristics;
processing, at a transceiver circuit, the output signal from the predistortion circuit in dependence upon a certain transceiver transfer function;
amplifying, at an amplification circuit, the signal in dependence upon an amplification transfer function;
generating a first envelope signal, at a first envelope detector circuit, based on a first sampled signal from the input signal of the amplification circuit;
attenuating, at a variable attenuator circuit, a second sampled signal from the output signal of the amplification circuit in dependence upon an attenuation factor;
generating a second envelope signal, at a second envelope detector circuit, based on the attenuated signal;
detecting, at a difference amplifier circuit, the difference between the first envelope signal and the second envelope signal, and outputting a compression indication signal; and
controlling, at a compare and adapt circuit, the predistortion circuit for controlling the adjustment of the distorted signal in dependence upon the received compression indication signal.

21. The method of claim 20, comprised of said step of controlling the adjustment of the distorted signal in dependence upon the received compression indication signal comprising:
converting, at an analog-to-digital converter circuit, the compression indication signal into a sequence of compression indication samples;
controlling, at a detection calibration circuit, the variable attenuator circuit to adjust the attenuation factor in dependence upon the sequence of compression indication samples, in order to maintain the attenuated signal to be equal to the first sampled signal when the amplification circuit is not operating in a compression mode;
delaying, at a variable delay circuit, a sequence of amplitude samples of the input signal by a certain amount;
constructing a compression reference look-up table for storing amplitude values and corresponding compression indication values;
receiving the delayed amplitude samples and generating sequence of reference compression indication samples in dependence upon the compression reference look-up table;
controlling, at a time alignment circuit, the variable delay circuit by comparing the reference compression indication samples with the corresponding compression indication samples;
generating, at a compare circuit coupled, a sequence of error values representing the differences between the corresponding reference compression indication samples and the corresponding compression indication samples; and
integrating, at an error integration circuit, the sequence of error values, and outputting a sequence of integrated error values.

22. The method of claim 21, further comprising controlling, at a threshold circuit, the error integration circuit to ignore the input error values whenever the compression indication sample exceeds a certain threshold value.

23. The method of claim 21, comprised of said step of distorting an input signal and adjusting the distorted signal in dependence upon a variation of a circuit characteristics comprising:
converting, at a Cartesian to polar conversion circuit, the input signal into a sequence of amplitude samples;
constructing a predistortion look-up table for storing amplitude sample values and corresponding predistortion correction values;
receiving the amplitude samples and generating the corresponding sequence of predistortion correction values in dependence upon the predistortion look-up table;
multiplying, at a vector multiplier circuit, the amplitude samples with the corresponding predistortion correction values and outputting a sequence of distorted amplitude samples;
multiplying, at a multiplier circuit, the distorted amplitude samples with corresponding integrated error values, and outputting a sequence of corrected amplitude samples; and converting, at a polar to Cartesian circuit, the sequence of corrected amplitude samples.

* * * * *